United States Patent
Richter et al.

(10) Patent No.: US 8,048,330 B2
(45) Date of Patent: Nov. 1, 2011

(54) METHOD OF FORMING AN INTERLAYER DIELECTRIC MATERIAL HAVING DIFFERENT REMOVAL RATES DURING CMP

(75) Inventors: Ralf Richter, Dresden (DE); Thomas Foltyn, Zwickau (DE); Anthony Mowry, Buda, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 758 days.

(21) Appl. No.: 12/127,921

(22) Filed: May 28, 2008

(65) Prior Publication Data
US 2009/0170319 A1    Jul. 2, 2009

(30) Foreign Application Priority Data
Dec. 31, 2007 (DE) .......... 10 2007 063 271

(51) Int. Cl.
*B44C 1/22* (2006.01)
*H01L 21/304* (2006.01)
(52) U.S. Cl. ......... 216/88; 216/84; 216/87; 216/89; 438/692; 438/693
(58) Field of Classification Search ......... 216/41, 216/84, 87, 88, 89; 438/692, 693
See application file for complete search history.

(56) References Cited

U.S. PATENT DOCUMENTS

| | | | |
|---|---|---|---|
| 5,494,854 A | 2/1996 | Jain | 437/195 |
| 5,674,784 A | 10/1997 | Jang et al. | 437/195 |
| 5,880,039 A | 3/1999 | Lee | 438/763 |
| 6,924,184 B2 * | 8/2005 | Cave et al. | 438/201 |
| 2002/0042201 A1 | 4/2002 | Willis | 438/692 |
| 2004/0192068 A1* | 9/2004 | Vulpio | 438/778 |
| 2008/0026552 A1* | 1/2008 | Gerhardt et al. | 438/589 |

FOREIGN PATENT DOCUMENTS
EP  0 621 630 A1   3/1994
WO  WO 97/12393    4/1997

OTHER PUBLICATIONS

Translation of Official Communication from German Patent Application No. 10 2007 063 271.3 dated Jul. 17, 2008.

* cited by examiner

*Primary Examiner* — Shamim Ahmed
(74) *Attorney, Agent, or Firm* — Williams, Morgan & Amerson, P.C.

(57) ABSTRACT

By providing an interlayer dielectric material with different removal rates, a desired minimum material height above gate electrode structures of sophisticated transistor devices of the 65 nm technology or 45 nm technology may be obtained. The reduced removal rate above the gate electrode may thus provide enhanced process robustness during the planarization of the interlayer dielectric layer stack prior to the formation of contact elements.

22 Claims, 6 Drawing Sheets

METHOD OF FORMING AN INTERLAYER DIELECTRIC MATERIAL HAVING DIFFERENT REMOVAL RATES DURING CMP

BACKGROUND OF THE INVENTION

1. Field of the Invention

Generally, the present disclosure relates to the formation of integrated circuits, and, more particularly, to the formation of an interlayer dielectric between and over circuit elements including line elements, such as gate electrodes, polysilicon interconnect lines and the like that create a pronounced surface topography for subsequent manufacturing processes.

2. Description of the Related Art

The fabrication of integrated circuits requires the formation of a large number of circuit elements on a given chip area according to a specified circuit layout, wherein the circuit elements are usually formed in and on a semiconductor layer by performing a plurality of processes, such as lithography processes, etch processes, implantation processes, deposition processes, anneal processes and the like. Generally, a plurality of process technologies are currently practiced, wherein, for complex circuitry, such as microprocessors, storage chips and the like, MOS technology based on silicon is currently the most promising approach due to the superior characteristics in view of operating speed and/or power consumption and/or cost effectiveness. During the fabrication of complex integrated circuits using MOS technology, millions of transistors, i.e., N-channel transistors and/or P-channel transistors, are formed on a substrate including a crystalline silicon or silicon-containing layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors, resistors and the like, are formed in a common layer, which will be referred to hereinafter as a device layer, whereas the "wiring," i.e., the electrical connection of circuit elements according to the circuit design, may be accomplished only to a certain degree by means of polysilicon lines and the like within the device layer so that a plurality of additional "wiring" layers formed over the device layer may be required. These wiring layers include metal lines embedded into an appropriate dielectric material, such as silicon dioxide, silicon nitride and the like, or, in very advanced devices, low-k materials having a permittivity of 3.0 or less are used. The metal lines and the surrounding dielectric material will hereinafter be referred to as a metallization layer. Between two adjacent metallization layers and also between the device layer and the first metallization layer, respective interlayer dielectrics are formed through which metal-filled openings are formed to establish the electrical connection between metal lines or between circuit elements and metal lines.

In typical applications, the interlayer dielectric separating the device layer from the first metallization layer is essentially formed from silicon dioxide that is deposited by well-established plasma enhanced chemical vapor deposition (PECVD) techniques, which enable the formation of a smooth and dense silicon dioxide film with sufficient conformality at moderately high deposition rates. Upon further device scaling resulting in gate lengths of MOS transistors on the order of less than 50 nm also the lateral dimensions of the metal lines and the vias have to be adapted to the reduced critical dimensions in the device layer. For example, the contact elements formed in the interlayer dielectric separating the device layer from the first metallization layer may have to be formed with dimensions of less than 100 nm. On the other hand, a pronounced surface topography may have been created during the preceding fabrication of the circuit elements, such as the gate electrode structures, which may extend from the basic semiconductor layer with a height of approximately 100 nm and more, even for advanced transistors of the 60 nm technology. Hence, the interlayer dielectric material may have to be provided such that the height levels of the gate electrode structures are at least leveled in other device regions while extra height for forming the contacts may also have to be taken into consideration. Moreover, the manufacturing flow for forming the contact elements may also result in a varying amount of material loss of the interlayer dielectric, depending on process fluctuations. For these reasons, the initial thickness of the interlayer dielectric material may have to additionally provide sufficient process margins when implementing a respective manufacturing flow in a volume production environment. On the other hand, the aspect ratio for patterning and refilling the contact openings may be restricted by technological constraints so that, for given critical dimensions of the contact elements, the thickness of the interlayer dielectric material may not be arbitrarily set to a target height that would accommodate all the process tolerances of the manufacturing processes involved, as will be explained in more detail with reference to FIGS. 1a-1d.

FIG. 1a schematically illustrates a top view of a portion of a semiconductor device 100. The semiconductor device 100 comprises a substrate (not shown in FIG. 1a) above which is formed a semiconductor layer (not shown) in and above which circuit elements, such as a transistor and the like, are formed. For convenience, a circuit element in the form of a transistor 150 is illustrated. The transistor 150 may comprise a gate electrode structure 151, sidewalls of which may be covered by a spacer element 152. Laterally adjacent to the gate electrode structure 151, drain and source regions 153 are provided which, in addition to a channel region (not shown), may be located below the gate electrode structure 151 and may represent an active region in the corresponding semiconductor layer. The active region may be bordered by an isolation structure 102, above which also a portion of the gate electrode structure 151 may be positioned, thereby defining a contact region 154 that is in contact with a contact plug or contact element 110. Similarly, one or more contact elements 111 may be provided so as to connect to the drain and/or source regions 153, wherein, for convenience, only one such contact element 111 is illustrated. It should be appreciated that the contact elements 110, 111 are typically formed in an appropriate interlayer dielectric material which for convenience is not shown in FIG. 1a.

FIG. 1b schematically illustrates a cross-sectional view along the line 1b as shown in FIG. 1a, wherein the semiconductor device 100 is illustrated in a manufacturing stage in which the contact elements 110, 111 are not yet formed. As shown, the semiconductor device 100 comprises a substrate 101, which represents any appropriate carrier material, such as a silicon substrate, a silicon-on-insulator (SOI) substrate and the like. A silicon-based semiconductor layer 103 is formed above the substrate 101, and the isolation structure 102, for instance in the form of a trench isolation, defines an active region 104 in which are positioned the drain and source regions 153, i.e., respective dopant concentrations, so as to define respective PN junctions with the remaining portion of the active region 104. Furthermore, a gate insulation layer 156 is formed on the semiconductor material of the active region 104, thereby isolating the gate electrode structure 151 from the active region 104. Moreover, metal silicide regions 155 may be formed in the drain and source regions 153, thereby defining a contact region thereof. Similarly, the metal silicide 155 may also be formed on the gate electrode structure 151 including the contact portion 154 (FIG. 1a), thereby also defining a respective contact region for the gate electrode structure 151. Furthermore, the semiconductor device comprises an interlayer dielectric material 105 which typically comprises two or more dielectric layers, such as the layers 105A and 105B, wherein the former one may represent a contact etch stop layer comprised of silicon nitride and the latter one may represent a silicon dioxide material.

In advanced applications, the etch stop layer 105A may additionally act as a strain-inducing material for generating a desired type of strain in the active region 104. Therefore, the layer 105A may be formed so as to have a high internal stress level, while the thickness thereof is selected such that a high mount of stressed material may be positioned in the vicinity of the transistor 150. However, the thickness of the layer 105A is restricted by the gap fill capabilities of plasma enhanced deposition techniques for forming the highly stressed silicon nitride material that is usually employed for the layer 105A. For example, the thickness of the layer 105A may be restricted to less than approximately 100 nm in sophisticated devices. Furthermore, the thickness of the interlayer dielectric material 105 is selected so as to obtain a desired height level above the active region 104 and the isolation structure 102 and to provide a sufficient distance between the gate electrode structure 151 and a first metallization layer still to be formed, while also taking into consideration a material loss during the further manufacturing flow for forming the contact elements 110, 111 (FIG. 1a) and the first metallization layer. On the other hand, the thickness of material 105 and thus of the layer 105B may not exceed a certain limit in order to respect the aspect ratio restrictions for patterning and filling the contact elements 110, 111.

A typical process flow for forming the semiconductor device 100 as shown in FIG. 1b may comprise the following processes. After forming the circuit element 150 on the basis of well-established techniques in accordance with design rules of the respective technology node, which includes forming the appropriate gate insulation layer 156 and patterning the same along with the gate electrode structure 151 by sophisticated lithography and etch techniques. The drain and source regions 153 may be formed by ion implantation, using the spacer structure 152 as an appropriate implantation mask. After any anneal cycles, the metal silicide regions 155 are formed, followed by the deposition of the etch stop layer 105A, typically by PECVD, since PECVD of silicon nitride may be accomplished at moderately low temperatures of less than approximately 600° C., which is compatible with preceding manufacturing processes and materials, such as metal silicides 155 and the like. As previously discussed, the ongoing shrinkage of feature sizes also entails that a distance between neighboring circuit elements in densely packed device regions is reduced and may be less than approximately 150 nm in currently manufactured CPUs of the 65 nm technology node. Hence, any deposition techniques for forming a dielectric layer for embedding the gate electrode structure 151, which may have a height of approximately 100-150 nm, have to meet the requirements of an appropriate fill capability so as to reliably and completely fill the empty spaces between the neighboring circuit elements. Moreover, the process parameters of the PECVD process for the deposition of the silicon nitride material of the layer 105A in a highly stressed state may be selected so as to obtain the desired stress level rather than obtaining an optimum fill behavior. Therefore, for well-established PECVD process recipes for silicon nitride, the layer 105A may be deposited in a more or less conformal fashion only with a thickness of approximately 100 nm or less.

Thereafter, the silicon dioxide layer 105B is deposited, which is typically done by PECVD on the basis of precursors TEOS (tetra-ethyl-ortho-silicate) and oxygen, since PECVD allows the deposition of silicon dioxide in a moderately conformal manner—yet with less gap filling qualities compared to thermal CVD—with relatively high mechanical stability at temperatures below 600° C. at high deposition rates, which provides a high production yield. After deposition, the silicon dioxide layer 105B has a certain topography caused by the underlying structure of the gate electrode structure 151, which may jeopardize subsequent manufacturing processes, such as a photolithography step for forming contact openings for the contact elements 110, 111. Consequently, the standard process flow requires that the silicon dioxide layer 105B be planarized, typically by chemical mechanical polishing (CMP), wherein excess material of the silicon dioxide layer 105B is removed by chemical and mechanical interaction with a slurry and a polishing pad to finally obtain a substantially planarized surface 105S of the silicon dioxide layer 105B. The CMP process itself is a highly complex process and requires sophisticated process recipes, wherein the removal rate significantly depends on the characteristics of the silicon dioxide layer 105B, such as density, mechanical stress, water contents and the like. Due to the complexity of the CMP process and due to any fluctuations in the preceding processes, such as the deposition of the layer 105B, the finally obtained height 105H of the layer 105B above the gate electrode structure 151 may also vary during volume production processes. Moreover, the height 105H may have to also accommodate further material losses in subsequent processes, while, on the other hand, a critical height above the active region should not be exceeded, since here the high aspect ratio contact elements 111 are to be formed so that extra height in this area may increase the probability of creating contact failures.

FIG. 1c schematically illustrates the device 100 in a further advanced manufacturing stage. As shown, the contact elements 110 (not shown in this cross-sectional view) and 111 are formed in the interlayer dielectric material 105 and typically comprise a barrier material 111A, for instance in the form of a titanium liner and a titanium nitride liner, while the actual fill material 111B may be provided in the form of a tungsten material.

The contact elements 110, 111 may be formed by well-established techniques including deposition processes for forming an anti-reflective coating (ARC) material and patterning the same by photolithography to obtain an etch mask for forming contact openings in the layers 105B and 105A. Thereafter, the etch mask is removed and the barrier material 111A and the fill material 111B are deposited. During the preceding sequence, that is, the patterning of the contact openings and the filling thereof, the process yield may depend on the aspect ratio of the contact openings, as previously explained. Next, excess material of the fill material 111B is removed, for instance by CMP. However, during the patterning of the contact openings and the removal of the excess material, a further material loss of the layer 105B may occur, as indicated by 105L. This additional reduction in height 105L may be approximately 100 nm and may need to be taken into consideration when selecting the initial target height of the layer 105, thereby further contributing to an increased aspect ratio of the contact element 111 and at a lesser extent of the contact element 110.

Consequently, the contact element 111 connecting to the drain or source region 153 may have a moderately high aspect ratio, since the lateral size thereof is substantially restricted by the lateral dimension of the drain and source regions 153, while the depth of the contact element 111 is determined by the thickness of the interlayer dielectric material 105. On the other hand, the contact element 110 only has to extend down to the top surface of the gate electrode structure 151, i.e., to the contact portion 154 (FIG. 1a), while also the lateral dimension of the contact element 110 may be different compared to the element 111, depending on the size and shape of the contact portion 154. The contact elements 110, 111 typically comprise a barrier material in the form of a titanium liner, followed by a titanium nitride liner, while the actual fill material may be provided in the form of a tungsten material.

FIG. 1d schematically illustrates the device 100 with a metallization layer formed above the interlayer dielectric material 105. The metallization layer, which is the first metallization layer of the device 100, typically comprises an etch stop layer 123, for instance in the form of silicon nitride, silicon carbide, nitrogen-enriched silicon carbide and the like, on which may be formed an appropriate dielectric material 124, such as a low-k dielectric material having a relative permittivity of 3.0 or less. Moreover, respective metal lines 121, 122 are formed in the dielectric material 124 and connect to the contact elements 110, 111, respectively. The metal lines 121, 122 may comprise a copper-containing metal in combination with an appropriate barrier material, such as a material comprising tantalum, tantalum nitride and the like. Finally, a cap layer 126 is typically provided to confine the copper material in the metal lines 121, 122, which may be accomplished on the basis of dielectric materials such as silicon nitride, silicon carbide and the like.

The metallization layer may be formed by depositing the etch stop layer 123 followed by the deposition of the dielectric material 124. Next, respective trenches are formed in the dielectric material 124 according to well-established single damascene strategies. Next, the metal lines 121, 122 may be formed by depositing a barrier layer and filling in a copper-based material, for instance on the basis of electroplating, which may be preceded by the deposition of a copper seed layer. Finally, any excess material may be removed, for instance by CMP, and the cap layer 126 may be deposited. During the patterning of the trenches, the reduced height 105R may need to be within specified tolerances so as to ensure a reliable patterning process. However, due to the preceding process fluctuations, in particular the CMP processes for planarizing the layer 105B, in combination with the material loss 105L and the stringent requirements with respect to the aspect ratio of the contact elements 110, 111, the required minimum height 105R may be difficult to be achieved in sophisticated applications, such as the formation of devices of the 65 nm or 45 nm technology.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and devices in which an interlayer dielectric stack may be formed in such a manner that respective constraints imposed by processes for planarizing and patterning the interlayer dielectric material may be respected, while at the same time a minimum material thickness may be provided above critical device regions, such as gate electrode structures. For this purpose, the principles disclosed herein contemplate the local adaptation of the removal rate during a specified CMP process in order to provide enhanced process control. In some illustrative aspects disclosed herein, the enhanced process control and robustness may be accomplished by forming a first portion of the interlayer dielectric material to exhibit a reduced removal rate, followed by the deposition of a further portion of interlayer dielectric material having a higher removal rate. Consequently, upon exposing the first portion of the interlayer dielectric material that has been deposited in a more or less conformal manner, the removal of the material may be slowed down at critical device areas, such as above gate electrode structures and the like. In other illustrative aspects disclosed herein, the overall controllability of the CMP process may, additionally or alternatively, be enhanced by selectively modifying the material characteristics to obtain different removal rates at specific device areas.

One illustrative method disclosed herein comprises forming a first dielectric layer above a transistor comprising a gate electrode structure. Moreover, the method comprises forming a first interlayer dielectric material above the first dielectric layer by using a specified precursor material, wherein the first interlayer dielectric material has a first removal rate with respect to a specified chemical mechanical polishing recipe. The method further comprises forming a second interlayer dielectric material above the first interlayer dielectric material using the specified precursor material, wherein the second interlayer dielectric material has a second removal rate with respect to the specified chemical mechanical polishing recipe and wherein the first removal rate differs from the second removal rate. Finally, the method comprises planarizing a surface of a layer stack comprising the first dielectric layer and the first and second interlayer dielectric materials by performing a planarization process that includes a chemical mechanical polishing process performed on the basis of the specified chemical mechanical polishing recipe.

A further illustrative method disclosed herein relates to forming a dielectric interlayer stack in a semiconductor device. The method comprises forming a first dielectric layer above a device layer of the semiconductor device, wherein the device layer has a non-planar surface topography. The method further comprises forming at least one CMP control layer above the first dielectric layer. Moreover, an interlayer dielectric material is formed above the first dielectric layer and the interlayer dielectric material is planarized by performing a CMP process using the at least one CMP control layer for locally reducing the removal rate.

A still further illustrative method disclosed herein relates to the formation of a dielectric interlayer stack of a semiconductor device. The method comprises depositing an interlayer dielectric material comprising silicon dioxide above a device layer that has a non-planar surface topography. The method further comprises adjusting a material characteristic of the interlayer dielectric material so as to obtain a locally reduced removal rate with respect to a specified CMP process recipe at a device region defining a point of maximum height of the surface topography. Finally, the method comprises planarizing the interlayer dielectric material by performing a CMP process using the specified process recipe.

BRIEF DESCRIPTION OF THE DRAWINGS

The disclosure may be understood by reference to the following description taken in conjunction with the accompanying drawings, in which like reference numerals identify like elements, and in which.

Figure 1A:
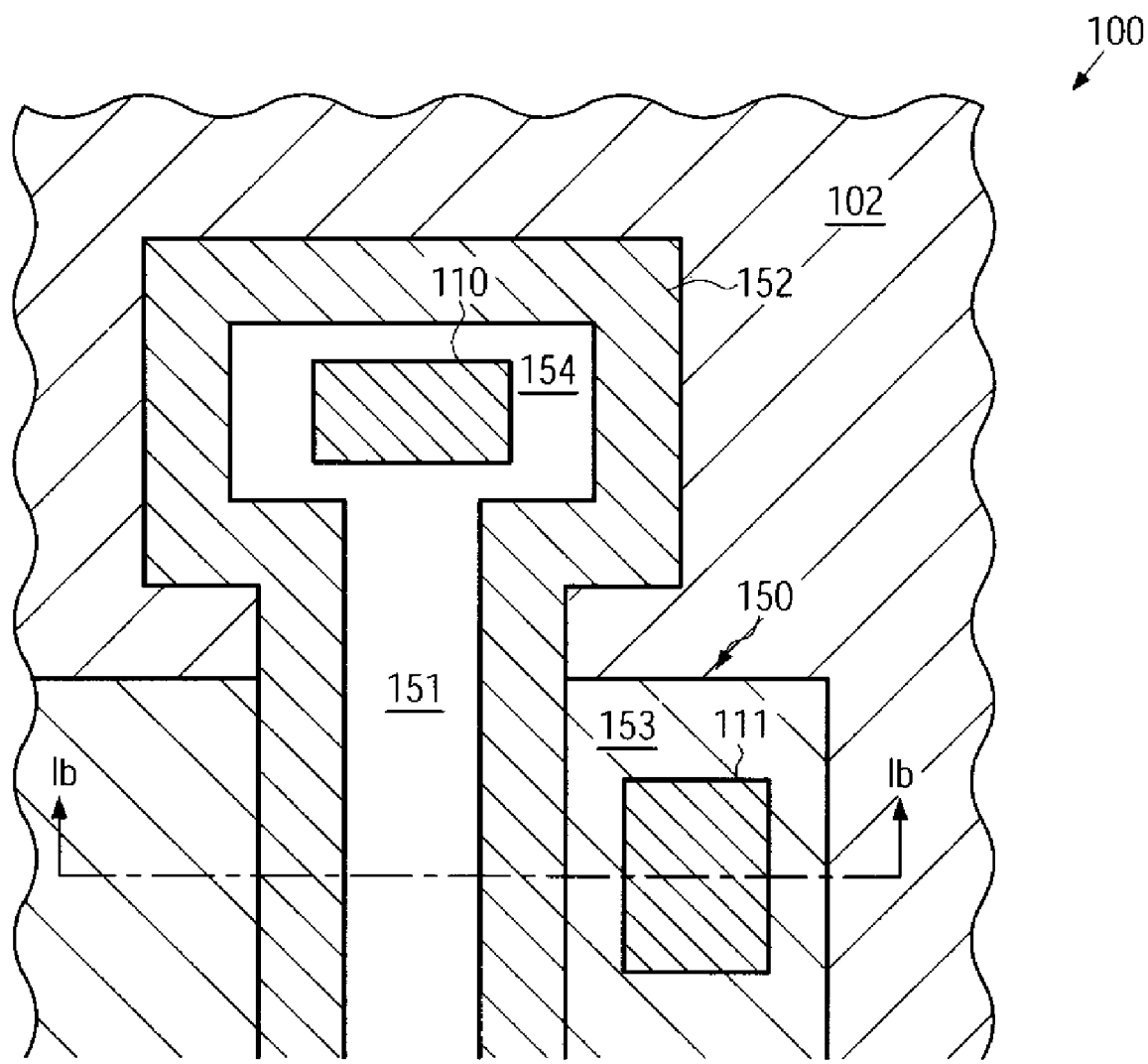
FIG. 1a schematically illustrates a top view of a semiconductor device including an advanced transistor element with contact elements formed in accordance with conventional techniques.
Figure 1B:
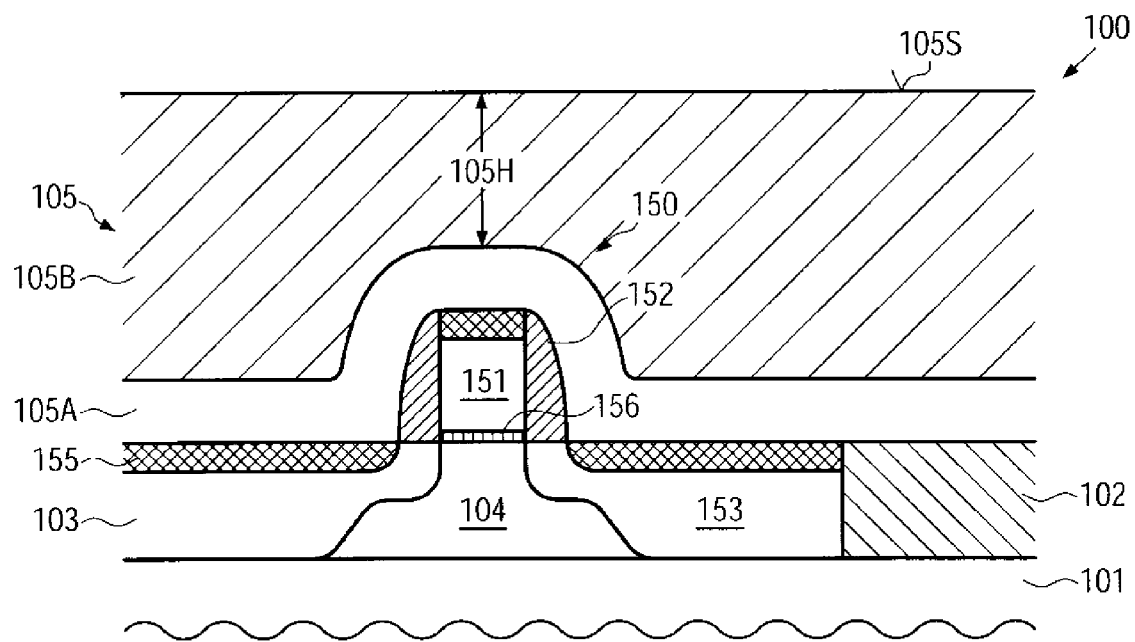
FIGS. 1b-1d schematically illustrate cross-sectional views of the device of FIG. 1a during various manufacturing stages in forming a contact structure and a first metallization level according to conventional techniques.
Figure 1C:
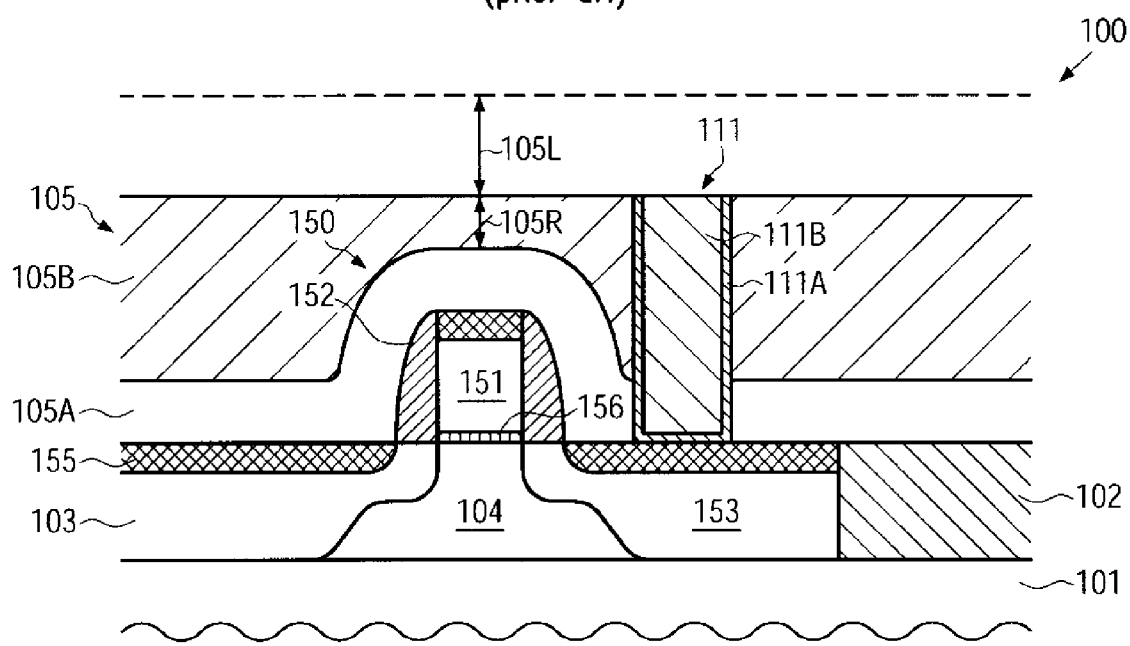
Figure 1D:
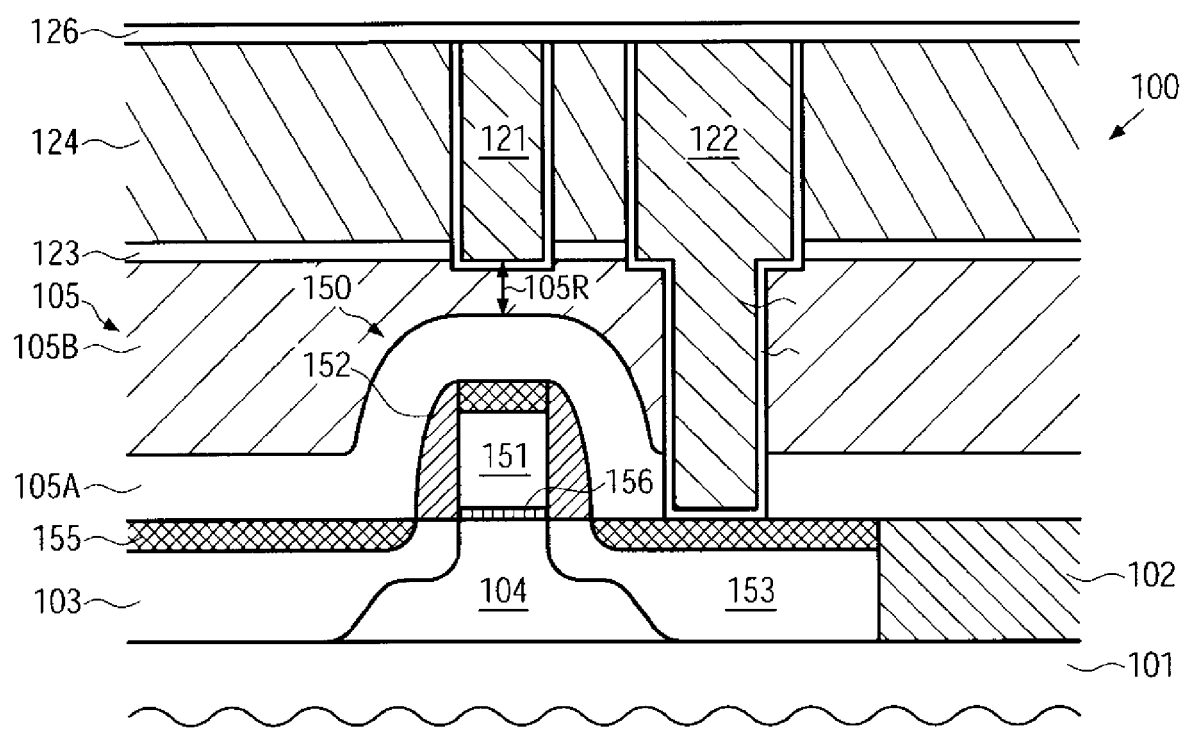

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein addresses the problem of providing an interlayer dielectric stack with a required height to conform with patterning strategies for forming contact elements connecting to respective device areas, wherein design-related aspect ratios may not be exceeded. For example, in highly advanced semiconductor devices, the total height of the dielectric layer stack may be approximately 350 nm or less, for instance 300 nm or less, at non-critical device regions, such as active areas and isolation structures, while, at the same time, a pronounced surface topography may exist in the device layer, for instance, in the form of gate electrode structures, which may have a height of approximately 120 nm or more. Consequently, in this situation, maintaining a desired minimum height of the interlayer dielectric material above the gate electrode structure, above which may also be positioned a dielectric etch stop material, in a stressed or non-stressed state, may be very difficult to be achieved in conventional approaches, in particular when volume production scenarios are considered. Therefore, it is contemplated herein to provide enhanced process efficiency when planarizing the interlayer dielectric material, wherein, in critical device areas, that is, areas of increased height, such as gate electrode structures, a reduced removal rate may be created, thereby efficiently compensating for process variations occurring during the planarizing process and the deposition of the interlayer dielectric material. Thus, at least during the final phase of the CMP process, the reduced removal rate above the critical device areas may result in a certain degree of "self-control" so that respective process variations may be significantly "weakened" at these critical areas, wherein a slightly non-planar geometry of the planarization in other areas, such as isolation regions and active areas of transistors not covered by the gate electrodes, may be acceptable and may not unduly affect the subsequent patterning of the contact openings.

In other illustrative embodiments disclosed herein, additionally, the removal rate may be increased at the critical device areas during an initial phase of the CMP process to obtain a substantially planar surface topography at a reduced process time so that a reduced initial layer thickness for the interlayer dielectric stack may be employed, which may thus also contribute to an overall enhanced process control or process robustness, since the process variability of the CMP process may be reduced.

In some illustrative aspects disclosed herein, the materials of different removal rates during the CMP process may have substantially the same material composition so as to provide a moderately uniform process behavior during patterning of contact openings. For instance, a silicon dioxide material formed on the basis of TEOS may be deposited so as to exhibit a different removal rate with a difference of approximately 20-30% or more by appropriately selecting one or more of the deposition parameters, such as pressure, temperature, gas flow rates, ion bombardment, when plasma assisted techniques are used, and the like. Consequently, a high degree of compatibility with conventional process techniques for forming an interlayer dielectric material on the basis of silicon dioxide may be maintained, while nevertheless enhancing the controllability of the CMP process, thereby ensuring a required minimum material height above critical device areas, such as gate electrode structures. Hence, the techniques disclosed herein may be advantageously applied to technology standards corresponding to 65 nm technology, 45 nm technology and the like. It should be appreciated, however, that the principles disclosed herein may also be applied to less critical applications, if desired. Hence, unless otherwise specified in the appended claims, the present disclosure should not be considered as being restricted to specific device dimensions.

Figure 2A:
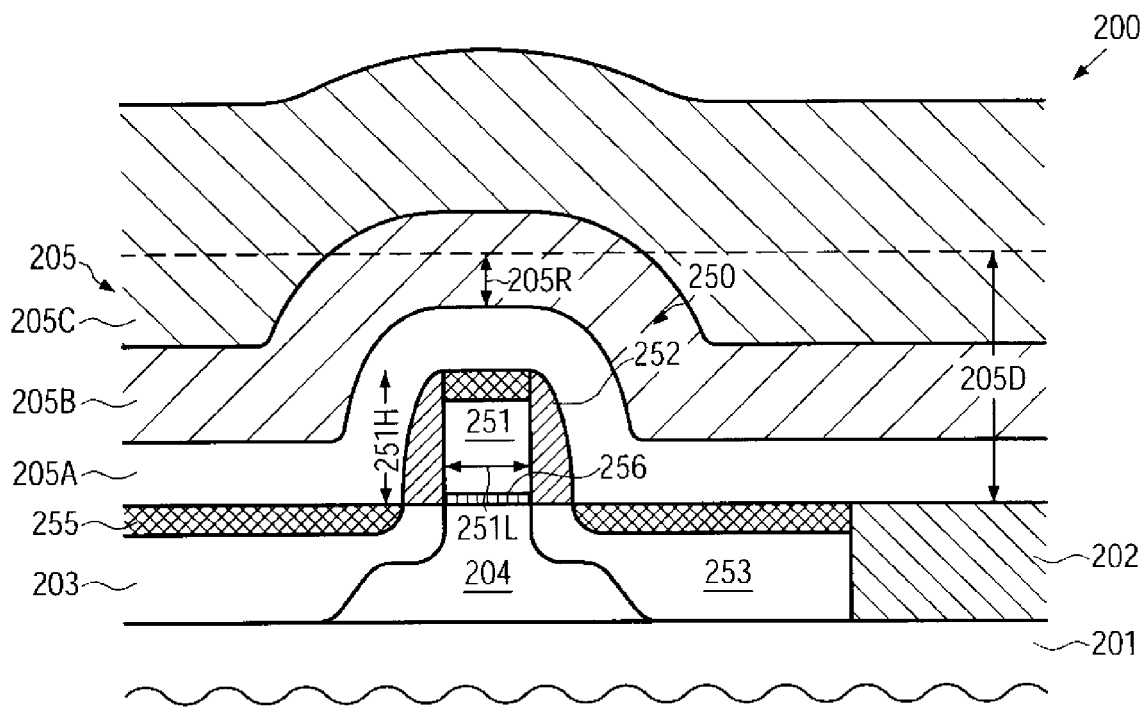
FIGS. 2a-2b schematically show cross-sectional views of a semiconductor device during various manufacturing stages in forming and planarizing an interlayer dielectric stack that provides enhanced controllability of a CMP process according to illustrative embodiments.

FIG. 2a schematically illustrates a cross-sectional view of semiconductor device 200 comprising a substrate 201 having thereabove a semiconductor layer 203, in and above which may be formed circuit elements, such as a transistor 250. The substrate 201 and the semiconductor layer 203 may have any appropriate configuration as may be required for the formation of the transistor 250 in accordance with design rules of the technology standard under consideration. For example, the substrate 201, in combination with the semiconductor layer 203, may represent an SOI configuration, wherein a buried insulating layer (not shown) may be located between the semiconductor layer 203 and the substrate 201. It should be appreciated that the substrate 201 and the semiconductor layer 203 may have a similar configuration as previously discussed with reference to the semiconductor device 100. Similarly, the transistor 250 may comprise a gate electrode structure 251 formed on a gate insulation layer 256, which separates the gate electrode structure 251 from an active region 204, which may be defined in the semiconductor layer 203 on the basis of an isolation structure 202. Furthermore, on sidewalls of the gate electrode structure 251 a spacer structure 252 is provided, wherein it should be noted that the spacer structure 252 may have any suitable configuration or may be removed in this manufacturing stage, depending on the overall process and device requirements. Moreover, drain and source regions 253 may be formed in the active region 204, wherein metal silicide regions 255 may be provided in the drain and source regions 253 and the gate electrode structure 251. In other illustrative embodiments, the gate electrode structure 251 may be comprised of any appropriate conductive material, possibly in combination with any high-k dielectric materials used in the gate insulation layer 256. Irrespective of the specific configuration of the transistor 250, a pronounced surface topography may be created by the transistor 250, which, in combination with the semiconductor layer 203, may also be referred to as a device layer, as previously explained. It should be appreciated that the transistor 250 may have a similar configuration as the transistor 150 previously described with reference to FIGS. 1a-1d.

Moreover, in the manufacturing stage shown in FIG. 2a, the semiconductor device 200 may further comprise an interlayer dielectric stack 205 comprising a first dielectric layer 205A, which may also act as an etch stop layer during the patterning of the interlayer dielectric stack, as previously discussed with reference to the device 100, and which may be comprised of silicon nitride, nitrogen-containing silicon carbide and the like. In some illustrative embodiments, the dielectric layer 205A may also act as a strain-inducing layer, wherein the type and the magnitude of the intrinsic stress of the layer 205A may be different in various device regions to obtain the desired local enhancement of device performance. As previously indicated, the layer 205A may be provided with a specified thickness to meet certain requirements with respect to avoiding deposition-related defects, in particular in densely packed device regions. Thus, in some illustrative embodiments, the thickness of the layer 205A may be approximately 100 nm or less, for instance approximately 80 nm or less, wherein a length of the gate electrode structure 251, indicated as 251L, may be approximately 40 nm or less, while a height 251H may be approximately 100 nm or higher, for instance, approximately 120 nm or more.

The layer stack 205 may further comprise a first interlayer dielectric material 205B, which may also be referred to as a CMP control layer, since the layer 205B may have a reduced removal rate with respect to a specified CMP recipe compared to a second interlayer dielectric material 205C. In some illustrative embodiments, the materials 205B, 205C may have substantially the same material composition, for instance the layers 205B, 205C may be substantially comprised of silicon dioxide, thereby providing substantially uniform behavior during the patterning of the interlayer dielectric materials 205B, 205C when forming contact openings. In other illustrative embodiments, the layers 205B, 205C may be comprised of different material composition, while having a substantially similar etch behavior that is, however, different than the behavior of the layer 205A. Hence, a high degree of compatibility to well-established patterning strategies for the interlayer dielectric stack may be maintained.

The materials 205B, 205C may be formed with an appropriate thickness to obtain a desired target height 205D at areas of the device 200 having a substantially planar surface topography. That is, the target height 205D may represent a desired height of the stack 205 at the active region 204, i.e., the portion not covered by the gate electrode structure 251 or the trench isolation structures 202. Consequently, the target height 205D, in combination with a specified lateral dimension of respective contact openings to be formed in the stack 205, determines an aspect ratio of the contact elements, such as the elements 110, 111, previously described with reference to the device 100. Thus, as previously explained, the target height 205D may need to be maintained within predetermined process tolerances, wherein the target height 205D, in combination with the gate electrode height 251H and the thickness of the layer 205A, may also determine a required minimum thickness 205R of the interlayer dielectric material 205C and/or 205B above the gate electrode structure 251. As previously discussed, respective process variations, in particular under volume production conditions, may result in an unacceptable reduction of the interlayer dielectric material above the gate electrode structure in conventional techniques, which are described with reference to the device 100. According to illustrative embodiments, the layer 205B may be formed with a thickness that is comparable with the desired minimum height 205R, thereby providing a locally reduced removal rate during the planarization of the material 205C in a later stage. In other illustrative embodiments, the material 205B may be provided with a significantly increased height compared to the height 205R and/or additional CMP control layers may be provided, as will be discussed later on in more detail.

The semiconductor device 200 as shown in FIG. 2a may be formed on the basis of the following processes. The transistor 250 may be formed in a similar manner as previously explained with reference to the device 100. Thereafter, the first dielectric layer 205A may be deposited, for instance, on the basis of PECVD, wherein, if required, process parameters may be adjusted to obtain a desired stress level in the layer 205A. Next, the interlayer dielectric material 205B may be deposited, for instance, on the basis of PECVD using TEOS as a precursor material, wherein the deposition may be performed in an oxygen-containing ambient according to well-established recipes. In other cases, the material 205B may be deposited by using a thermally activated chemical vapor deposition (CVD) process on the basis of TEOS, possibly in combination with ozone, wherein the deposition ambient may be established on the basis of a pressure of approximately 200-700 Torr. For this reason, this deposition technique may be referred to as sub-atmospheric chemical vapor deposition (SACVD). Typically, SACVD techniques performed on the basis of TEOS for forming a silicon dioxide may exhibit an excellent gap filling behavior, thereby enabling the filling of gaps between densely packed circuit elements, such as gate electrode structures. For example, a plurality of gate electrode structures may define a specified surface topography with a distance between neighboring gate electrode structures of approximately 200 nm and less. Depending on the height of the gate electrode structures, a moderately high aspect ratio may thus be created, which may further be increased by the deposition of the dielectric layer 205A. In this case, the deposition of silicon dioxide material on the basis of SACVD techniques may nevertheless provide reliable filling of any gaps created by the preceding deposition of the material 205A.

During the deposition of the interlayer dielectric material 205B, at least one process parameter, such as pressure, temperature, ion bombardment, when a plasma assisted process is used, gas flow rates, supply rates for TEOS and the like, may be adjusted so as to obtain specific material characteristics that correspond to a specific removal rate for a predetermined CMP recipe. It should be appreciated that appropriate deposition parameter values may be readily established by depositing a material corresponding to the material 205B by using different values for one or more process parameters and determining the removal rates for the predetermined CMP recipe.

Similarly, the material 205C may be deposited by plasma assisted or thermally activated CVD, wherein the material characteristics are adjusted to correspond to a removal rate that is higher than the removal rate of the material 205B.

Figure 2B:
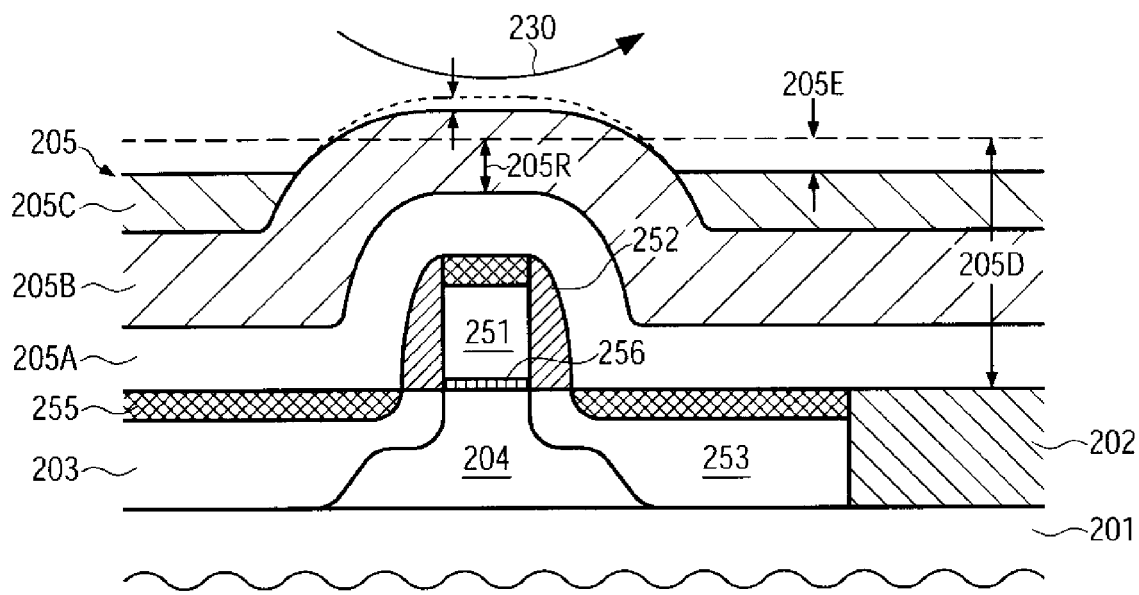

FIG. 2b schematically illustrates the device 200 during a final phase of a CMP process 230. As shown, a significant portion of the material 205C may have been removed during the process 230, which may be performed on the basis of the predetermined recipe, which may be substantially designed to obtain a desired removal rate when polishing the material 205C. For example, well-established recipes may be used, as for instance employed for forming the conventional device 100. Consequently, during the CMP process 230, the initially pronounced surface topography may be increasingly planarized, thereby "consuming" the material 205C, which may have been deposited with sufficient excess height to achieve a substantially planar surface topography, when arriving at the target height 205D. As previously explained, due to any process fluctuations, for instance variations from substrate to substrate or a variation of removal rate across the substrate 201, a more or less pronounced deviation from the target height 205D may occur, which may be acceptable within a specified range of tolerance within non-critical device regions, such as above the drain and source regions 253 and the isolation structure 202, while a similar tolerance above the gate electrode 251 may not be acceptable, since further process variations during the patterning of contact openings and refilling the same may result in a further significant material removal, as is previously explained. In the final phase of the process 230, as shown, a certain degree of "over-polishing" in non-critical device regions may occur, as indicated by 205E, for instance due to an increased polishing rate or a reduced deposition height during the previous deposition process. Although the reduced height as defined by the height 205E may be acceptable in the non-critical areas, a similar loss of material above the gate electrode structure 251 would not be compatible with the further processing. In this case, the reduced removal rate of the material 205B may locally slow down the material removal above the gate electrode structure 251, thereby still maintaining a sufficient amount of material to meet the requirements defined by the height 205R. Thus, a certain degree of local self-control of the process 230 may be accomplished at the critical device region corresponding to the points of maximum height of the surface topography of the device prior to forming the interlayer dielectric stack 205, thereby increasing the process margins with respect to process variations that may occur during the deposition of the stack 205 and the CMP process 230. For example, a difference in the removal rates of approximately 30% may therefore increase the respective process window for depositing the stack 205 and planarizing the same by approximately 30% compared to conventional techniques.

Figure 2C:
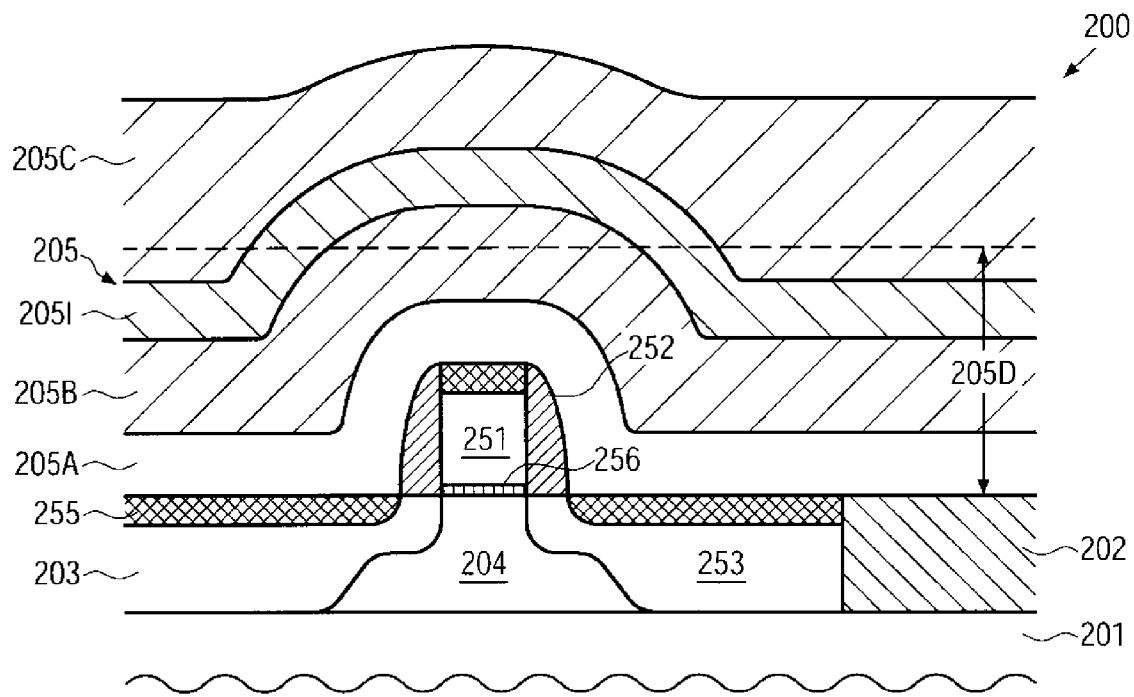
FIG. 2c schematically depicts a cross-sectional view of a semiconductor device comprising an interlayer dielectric stack including an etch stop layer and a plurality of layers of a dielectric material formed on the basis of the same precursor material while differing in removal rate during a CMP process according to still further illustrative embodiments.

FIG. 2c schematically illustrates the semiconductor device 200 according to further illustrative embodiments, in which the dielectric layer stack 205 may comprises three or more layers of different removal rate. As shown, a further layer 205I may be provided between the materials 205B and 205C, wherein the layer 205I may have an intermediate removal rate, that is, the removal rate may be higher compared to the material 205B but may be less than the removal rate of the material 205C. Furthermore, the layer 205I may, in some embodiments, be positioned to be below the target height 205D in the non-critical device regions. Consequently, during the CMP process 230, the material removal may be slowed down above the gate electrode structure 251 upon exposure of the layer 205I. When the target height 205D is reached in the non-critical device regions, in case that the overall process conditions may result in falling short of the target height in these regions, a further "over-polishing" caused by process variations may result in a less extensive material removal due to the reduced removal rate caused by the layer 205I. On the other hand, the material 205B may further provide sufficient process margins above the gate electrode structure 251.

It should be appreciated that a plurality of individual layers and materials, such as the materials and layers 205B, 205I, 205C, may be provided with different removal rates, thereby obtaining a desired profile for locally defining the polishing behavior. In other cases, a more or less continuous variation of the removal rate within the interlayer dielectric material may be obtained by correspondingly continuously varying one of more process parameters during the deposition of the interlayer dielectric material, such as the material 205B and possibly the material 205C. For example, the material 205B may be provided with a significantly increased thickness compared to the embodiments as shown in FIGS. 2a-2b, that is, the thickness of material having the substantially continuously varying removal rate may be significantly higher compared the desired thickness 205R, thereby achieving a moderately smooth transition from a desired high removal rate at the beginning of the CMP process to a increasingly reduced removal rate at the end of the CMP process.

Consequently, increased process margins may be employed during the deposition and planarizing of the interlayer dielectric material, i.e., the materials of the layer stack 205 formed above the first dielectric layer 205A, by locally reducing the removal rate above critical device regions, such as the gate electrode structure 251.

Thereafter, the further processing may be continued by forming contact openings and contact elements, followed by the formation of the first metallization layer. For this purpose, substantially the same process techniques may be applied as previously explained with reference to the device 100. It should be appreciated that a respective non-planar surface topography, which may be created during the CMP process 230 due to the different local removal rates, may not unduly affect the process for forming the contact elements, such as the contact elements 111, 110 (FIG. 1a), since the most critical contacts are formed above the non-critical device region, i.e., non-critical with respect to the initial surface topography, so that a reduced height compared to the target height in these regions may be acceptable as long as the respective height of the stack 205 is within the desired tolerances of the non-critical regions.

Figure 2D:
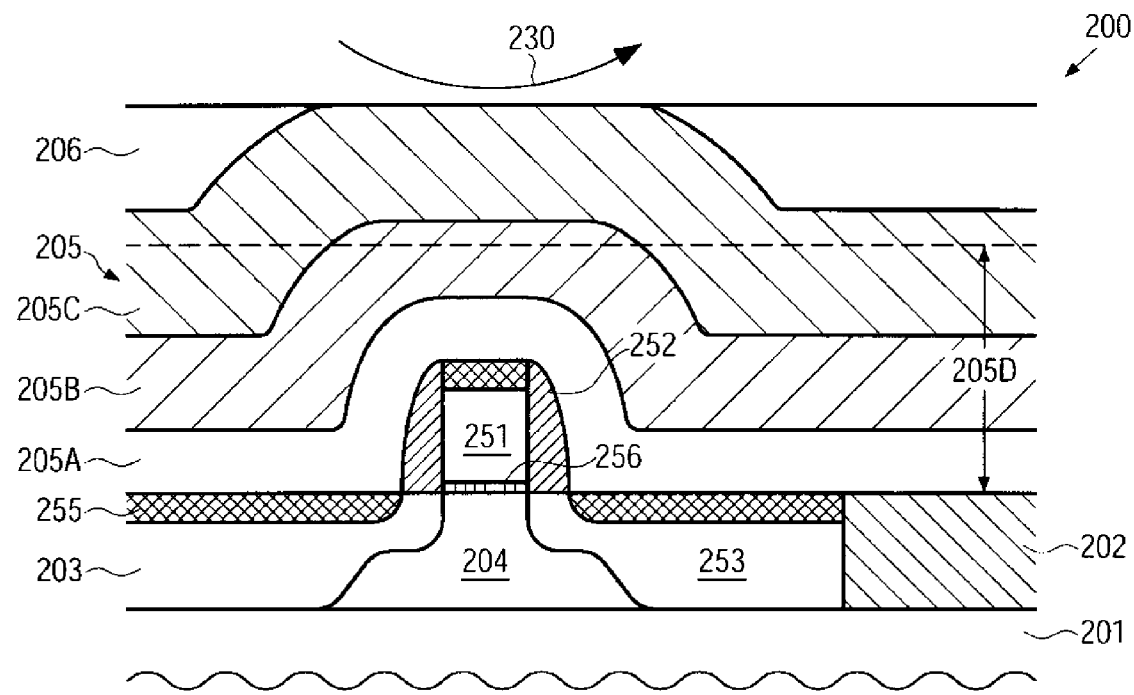
FIG. 2d schematically depicts a cross-sectional view of a semiconductor device according to still further illustrative embodiments, in which a mask layer may be provided in addition to the interlayer dielectric material so as to further enhance controllability of the CMP process.

FIG. 2d schematically illustrates the semiconductor device 200 according to further illustrative embodiments, in which a mask layer 206 may be formed such that a surface topography of the stack 205 may reduced. For instance, the mask layer 206 may be formed on the basis of a highly non-conformal deposition technique, such as spin coating techniques and the like, using a polymer material, which may be applied in a highly viscous state. Thereafter, the material of the mask layer 206 may be treated in any appropriate manner, for instance by radiation, heat and the like, so as to harden the layer 206. Subsequently, the device 200 may be subjected to the CMP process 230, wherein material of the layer 205C may be locally removed above the gate electrode structure 251, while a material removal of the layer 205C in the non-critical regions may be suppressed or delayed due to the presence of the mask layer 206. Consequently, during the progression of the CMP process 230, similar height levels above the gate electrode structure 251 and above the non-critical device regions, such as the isolation structure 202 and the portion of the active region 204 not covered by the gate electrode structure 251, may be obtained with reduced overall initial thickness of the stack 205, thereby further enhancing the overall uniformity of the process 230. Moreover, the material 205B having the reduced removal rate may provide enhanced process robustness, as previously explained.

Figure 2E:
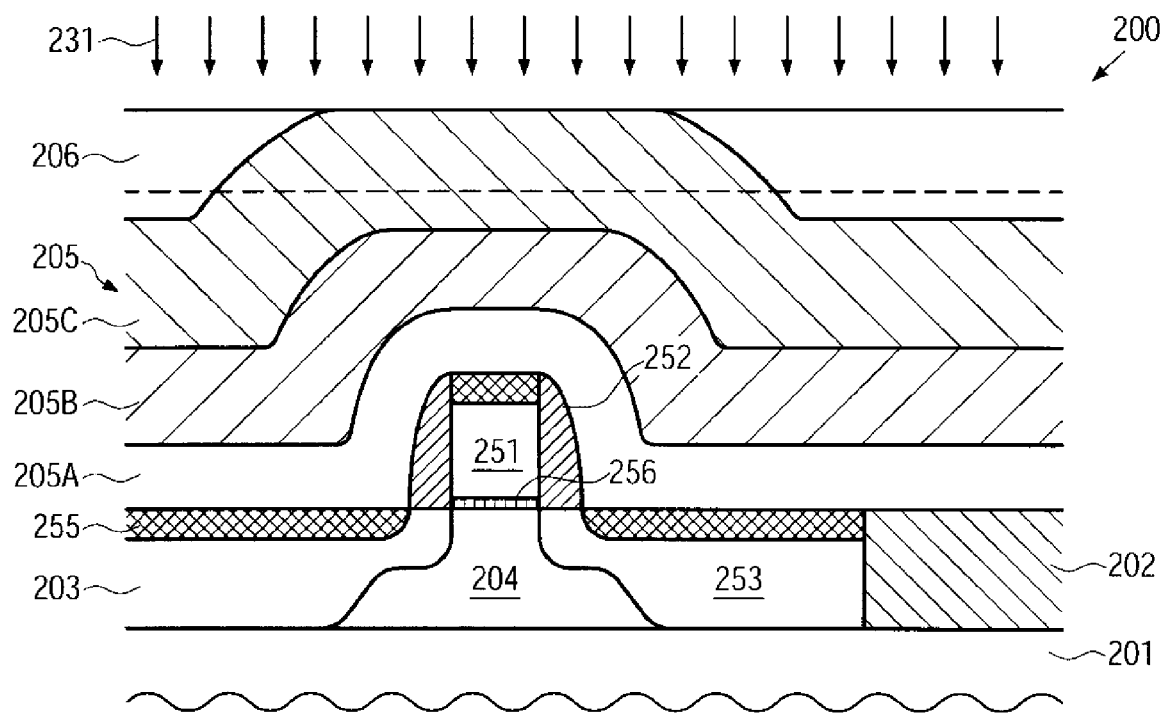
FIGS. 2e-2f schematically illustrate cross-sectional views of the semiconductor device during various manufacturing stages in forming an interlayer dielectric stack having a locally adapted removal rate with respect to a CMP process according to still further illustrative embodiments.

FIG. 2e schematically illustrates the semiconductor device 200 according to further illustrative embodiments, in which the mask layer 206 may be used as an implantation mask during an implantation process 231. During the process 231, an appropriate implantation species, such as germanium, xenon, silicon and the like, may be introduced into the material 205C to a depth that may substantially correspond to the thickness of the mask layer 206 or less, thereby avoiding a penetration of the material 205C covered by the mask layer 206. Consequently, the mechanical and/or the chemical characteristics of the exposed material portion, or of the non-exposed material portion when the mask layer may also cover the material 205C above the gate electrode 251, however with a reduced thickness, may be modified, thereby also modifying the removal behavior during the subsequent CMP process. For example, due to the ion bombardment, the molecular structure may be changed due to the heavy damage and the incorporation of the implantation species, which may result in a reduced mechanical strength and/or may provide a different chemical behavior, for instance due to increased diffusion paths for a chemical component contained in the slurry that may typically be used during the CMP process 230. In some illustrative embodiments, the CMP process 230 may be performed in the presence of the mask layer 206, wherein the ion bombardment may provide an increased removal rate above the gate electrode structure 251, irrespective of the behavior of the mask layer 206 during the CMP process. That is, even if the mask layer 206 may be rapidly ablated in an initial phase, nevertheless a significant difference in removal rate between the modified and the non-modified portions may be achieved, thereby enabling the planarization of the initially pronounced surface topography in a shorter process time, while the material 205B may provide enhanced process robustness during the final phase of the CMP process, as explained above.

Figure 2F:
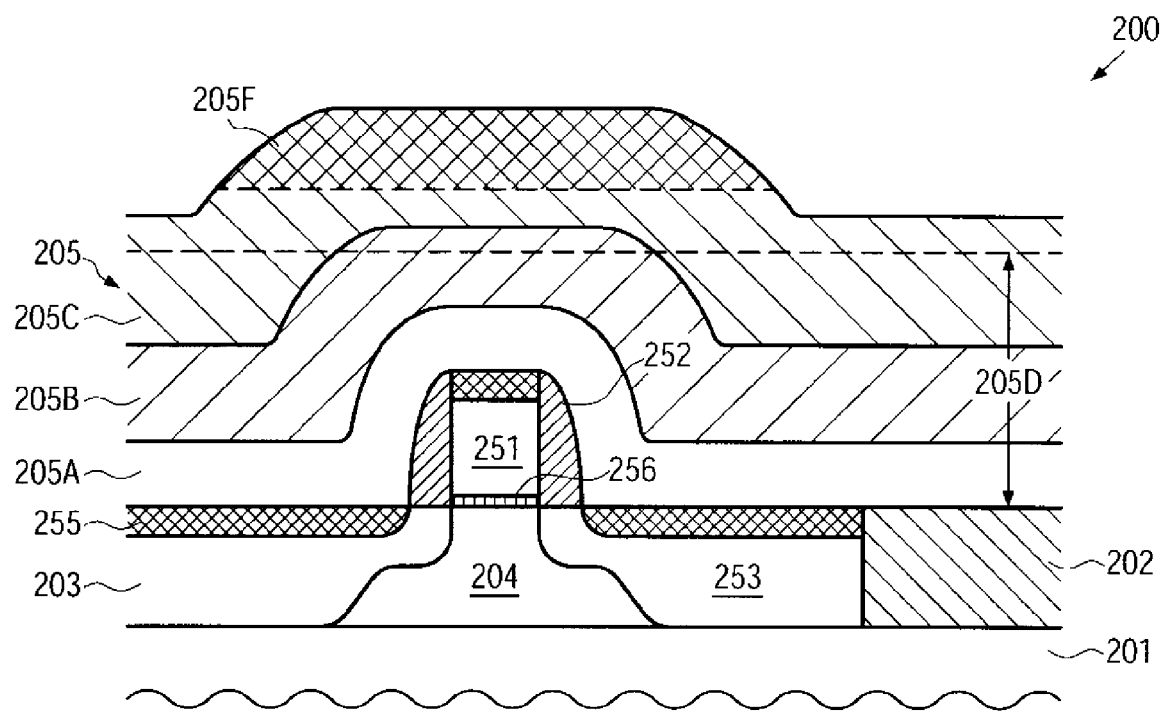

FIG. 2f schematically illustrates the device of FIG. 2e after the removal of the mask layer 206, which may be accomplished on the basis of well-established etch techniques, such as plasma ashing and the like. Consequently, the CMP process may be performed by using well-established recipes without having to take into consideration the presence of materials other than material 205C, wherein the previously modified portion 205F may provide fast leveling of the initial topography, thereby allowing reduction of the overall height of the initial layer stack 205 and/or reducing the overall polishing time. Hence, the overall controllability and robustness with respect to process variations of the CMP process may further be enhanced.

As a result, the subject matter disclosed herein provides an enhanced technique for forming an interlayer dielectric stack with a locally varying removal rate to provide increased process margins for critical device regions, i.e., for device regions corresponding to points of increased or maximum height in the initial topography prior to performing the CMP process, thereby increasing the overall process robustness in sophisticated applications. For this purpose, an interlayer dielectric material, in one embodiment a silicon dioxide containing material, may be provided in such a manner that the interlayer dielectric material exhibits a reduced removal rate above the critical device areas, such as gate electrode structures, at a final phase of the CMP process, thereby contributing to enhanced reliability in maintaining a desired minimum material height above the gate electrode structures. Consequently, a target height of the interlayer dielectric layer stack above non-critical device regions after the CMP process of approximately 300 nm or less may be accomplished, while also providing a required minimum thickness above the gate electrode structures, which may have a gate height of approximately 120 nm or even more.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
   forming a first dielectric layer above a transistor comprising a gate electrode structure;
   forming a first interlayer dielectric material above said first dielectric layer using a specified precursor material, said first interlayer dielectric material having a first removal rate with respect to a specified chemical mechanical polishing recipe;

forming a second interlayer dielectric material above said first interlayer dielectric material using said specified precursor material, said second interlayer dielectric material having a second removal rate with respect to said specified chemical mechanical polishing recipe, said second removal rate differing from said first removal rate; and planarizing a surface of a layer stack comprising said first dielectric layer and said first and second interlayer dielectric materials by performing a planarization process comprising a chemical mechanical polishing process performed on the basis of said specified chemical mechanical polishing recipe wherein at least a portion of said second interlayer dielectric material remains above at least a portion of said first interlayer dielectric material after performing said planarization process.

2. The method of claim 1, wherein said specified precursor material comprises TEOS (tetra ethyl orthosilicate).

3. The method of claim 1, wherein said first removal rate is less than said second removal rate.

4. The method of claim 1, further comprising forming at least one further inter-layer dielectric material above said first dielectric layer, said at least one further interlayer dielectric material having a removal rate with respect to said specified chemical mechanical polishing recipe that differs from said first and second removal rates.

5. The method of claim 1, wherein said first dielectric layer has a thickness of approximately 100 nm or less.

6. The method of claim 5, wherein a thickness of said layer stack is approximately 350 nm or less after planarizing said layer stack.

7. The method of claim 1, wherein forming said first interlayer dielectric material comprises performing a plasma enhanced chemical vapor deposition process.

8. The method of claim 1, wherein forming said second interlayer dielectric material comprises performing a plasma enhanced chemical vapor deposition process.

9. The method of claim 1, wherein forming said first interlayer dielectric material comprises performing a thermally activated chemical vapor deposition process.

10. The method of claim 1, wherein forming said second interlayer dielectric material comprises performing a thermally activated chemical vapor deposition process.

11. A method of forming a dielectric interlayer stack in a semiconductor device, the method comprising:

forming a first dielectric layer above a device layer of said semiconductor device, said device layer having a non-planar surface topography;

forming at least one dielectric chemical mechanical polishing control layer above said first dielectric layer;

forming an interlayer dielectric material above said first dielectric layer; and planarizing said interlayer dielectric material by performing a chemical mechanical polishing process using said at least one chemical mechanical polishing control layer for locally reducing a removal rate, wherein said dielectric interlayer stack comprises at least a portion of said at least one chemical mechanical polishing control layer and at least a portion of said interlayer dielectric material after performing said chemical mechanical polishing process.

12. The method of claim 11, wherein said at least one chemical mechanical polishing control layer and said interlayer dielectric material are formed on the basis of the same precursor material.

13. The method of claim 12, wherein a first one of said at least one chemical mechanical polishing control layer is formed above said first dielectric layer with a thickness selected to obtain at least a target height of an interlayer stack comprising said first dielectric layer, said at least one chemical mechanical polishing control layer and said interlayer dielectric material.

14. The method of claim 12, wherein said precursor material comprises TEOS.

15. The method of claim 14, wherein at least one of said at least one chemical mechanical polishing control layer and said interlayer dielectric material is formed by performing at least one of a plasma enhanced deposition process and a thermally activated deposition process.

16. The method of claim 11, wherein a first one and a second one of said at least one chemical mechanical polishing control layer are formed so as to have different removal rates.

17. The method of claim 11, further comprising forming, prior to planarizing said interlayer dielectric material, a mask layer on said interlayer dielectric material by performing a non-conformal deposition process.

18. The method of claim 17, wherein planarizing said interlayer dielectric material comprises removing material of said mask layer and said interlayer dielectric material commonly in an initial phase.

19. The method of claim 17, further comprising locally modifying the structure of a portion of said interlayer dielectric material by performing a particle bombardment using said mask layer as a mask.

20. A method of forming a dielectric interlayer stack of a semiconductor device, the method comprising:

depositing an interlayer dielectric material comprising silicon dioxide above a first dielectric material layer comprising silicon nitride, wherein said first dielectric material layer has a non-planar surface topography and said interlayer dielectric material comprises at least a second dielectric material layer and at least a third dielectric material layer;

adjusting a material characteristic of said interlayer dielectric material to obtain a locally reduced removal rate with respect to a specified chemical mechanical polishing process recipe at a device region defining a point of maximum height of said surface topography; and planarizing said interlayer dielectric material by performing a chemical mechanical polishing process using said specified process recipe, wherein at least a portion of said third dielectric material layer remains above at least a portion of said second dielectric material layer after performing said chemical mechanical polishing process.

21. The method of claim 20, wherein adjusting said material characteristic comprises depositing second dielectric material layer as a first silicon dioxide comprising material having a first removal rate and depositing third dielectric material layer as a second silicon dioxide comprising material having a second removal rate that is greater than said first removal rate.

22. The method of claim 20, wherein adjusting said material characteristic comprises performing a masked ion implantation process.

* * * * *